United States Patent
Golke et al.

(10) Patent No.: US 7,693,001 B2
(45) Date of Patent: Apr. 6, 2010

(54) SRAM SPLIT WRITE CONTROL FOR A DELAY ELEMENT

(75) Inventors: Keith W. Golke, Minneapolis, MN (US); Harry H L Liu, Maple Grove, MN (US); David K. Nelson, Medicine Lake, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/013,856

(22) Filed: Jan. 14, 2008

(65) Prior Publication Data
US 2008/0106955 A1    May 8, 2008

Related U.S. Application Data

(62) Division of application No. 11/440,892, filed on May 25, 2006, now abandoned.

(51) Int. Cl.
*G11C 8/00* (2006.01)
(52) U.S. Cl. .................. 365/230.05; 365/93; 365/194; 365/154
(58) Field of Classification Search .................. 365/194
See application file for complete search history.

(56) References Cited

U.S. PATENT DOCUMENTS 5,301,146 A * 4/1994 Hama .................. 365/154
7,366,006 B2 * 4/2008 Zhang .................. 365/154
2004/0246805 A1 * 12/2004 Nii .................. 365/226

OTHER PUBLICATIONS

Search Report for PCT/US2007/062641 dated Feb. 23, 2007.
Nelson D. K. et al., "150nm SOI Embedded SRAMs with Very Low Ser", SOI Conference, 2005. Proceedings. 2055 IEEE International Honolulu, HI, USA Oct. 3-6, 2005, Piscataway, NJ, USA, IEEE, Oct. 3, 2005, pp. 188-190, XP010866609. ISBN: 0-7803-9212-4, Figures 1(B), 2(C).
International Preliminary Report on Patentability for PCT/US2007/062641, 8 pgs., dated Dec. 11, 2008.

* cited by examiner

*Primary Examiner*—Hoai V Ho
*Assistant Examiner*—Jason Lappas
(74) *Attorney, Agent, or Firm*—Shumaker & Sieffert, P.A.

(57) ABSTRACT

A Static Random Access Memory (SRAM) having a split write control is described. The SRAM includes bit, write, and write-word lines. Each memory cell within the SRAM includes a delay which is coupled to a dedicated write-word line. When a cell is not being written, its delay receives a delay signal on its associated write-word line, which increases the response time of the cell. When a cell is to be written, however, its delay receives a bypass signal on its associated write-word line, which decreases the response time of the SRAM cell.

5 Claims, 5 Drawing Sheets

SRAM SPLIT WRITE CONTROL FOR A DELAY ELEMENT

RELATED APPLICATIONS

This application is a divisional of, claims priority to, and hereby incorporates by reference in its entirety U.S. patent application Ser. No. 11/440,892, filed on May 25, 2006 now abandoned.

GOVERNMENT RIGHTS

The United States Government has acquired certain rights in this invention pursuant to Contract No. DTRA01-03-D-0018 and Delivery No. DTRA01-03-D-0018-0001 awarded by the Defense Threat Reduction Agency.

FIELD

The present invention relates generally to the field of integrated circuit random access memories and more particularly a radiation hardened SRAM with split write control.

BACKGROUND

When speed is an important requirement, digital processing and storage circuits often use a Static Random Access Memory (SRAM), which, in contrast to a Dynamic Random Access Memory (DRAM), does not need to be periodically refreshed.

An SRAM includes arrays of individual SRAM cells. Each cell is addressed and accessed so that it may be "read" from or "written" to. Each cell includes a pair of cross-coupled inverters that store either a "high" or "low" voltage level. The cross-coupled inverters are coupled with a pass gate, such as a transistor to bit lines, that allows the cross-coupled inverters to be read from or written to. Unfortunately, in radiation environments, such as space and aerospace, the data state held by these cross-coupled inverters and other transistors are susceptible to upset from radiation events.

Because SRAM cells are made from semiconductor materials, such as silicon, a radiation event, such as a particle strike, may induce charge. This charge, or glitch, if large enough, may cause a node within the cross-coupled inverters to change state. If the state change results in a bit-flip or a change in state of the SRAM cell, it is referred to as a Single Event Upset (SEU) or a soft error.

One method that circuit and system designers use to prevent radiation events from causing an SEU in an SRAM is to introduce a resistive hardening element in the feedback loop between the two cross coupled inverters of the SRAM cell. The resistive hardening element is generally referred to as a delay element or a delay. Typically, except for during a write, the delay is enabled. When an SEU occurs, the delay increases the response time of a cell by preventing a radiation induced state change from propagating around the feedback loop until the charge deposited from the SEU is dissipated. During a write, however, the delay is disabled. Disabling the delay decreases the propagation time around the feedback loop and therefore, decreases the write time of the cell.

FIG. 1A shows an example SRAM cell 10 in a radiation hardened configuration. SRAM cell 10 includes inverter 12 cross-coupled with inverter 14. Inverter 12 includes Field Effect Transistor (FET) 16 coupled with FET 18. Inverter 14 includes FET 20 coupled with FET 22. The coupled drains of FETs 16 and 18 are coupled to a delay 24. Delay 24 is coupled to the gates of FETs 20 and 22 and it receives delay and bypass signals at a delay input 25.

In operation, data ports 26 and 28 input data signals, where the data signal on data port 28 is an inverse of the data signal on data port 26. To write and read SRAM cell 10, FETs 30 and 32 serve as pass gates that open and close a data path to inverters 12 and 14. Enable inputs 34 receive an enable signal that opens and closes this data path. For instance, when SRAM cell 10 is being written, FETs 30 and 32 open, and write drivers (not shown) use data ports 26 and 28 to communicate a voltage to inverters 12 and 14. On the other hand, when SRAM 10 cell is being read, FETs 30 and 32 also open; instead of receiving a voltage, however, inverters 12 and 14 output a voltage to data ports 26 and 28.

To increase radiation hardness, SRAM cell 10 includes delay element 24 in a feedback loop through the gates and drains of FETS 16-22. Delay 24, when enabled, delays propagation through the loop between a node 36 and a node 38. Delay 24 typically includes elements that can be controlled to increase or decrease the delay time of the feedback loop through delay input 25. FIG. 1B shows circuit elements that delay 24 may include. In this instance, delay 24 includes a FET 46 coupled with a resistance, such as a resistor 48. When FET 46 receives a bypass signal, a signal may then propagate through FET 48 and bypass resistor 48. On the other hand, when FET 46 receives a delay signal, it forces the signal to propagate through resistor 48, and thus increases the delay time of the feedback loop. The delay time of the feedback loop may be tailored by adding additional elements to the delay or bypass paths of the delay 24.

An example of SEU prevention is demonstrated as follows. If the voltage at node 38 is low, for instance, an SEU induced state change may cause the voltage at node 38 to go high. This high voltage will drive node 36 low. Delay 24, however, will continue to hold the gates of FETs 20 and 22 high so that node 38 returns low. Delay 24 effectively delays the switching, or response time, of the cross-coupled inverters. If the response time is greater than the time it takes for the radiation induced charge to dissipate (i.e., the recovery time), SRAM cell 10 has been effectively radiation hardened.

An SRAM includes column and row arrays of SRAM memory cells. Typically, memory cells are grouped together in order to store multiple bits; such a grouping is referred to as a memory word. A memory word contains at least one memory cell, and each memory cell within a memory word share a common write line. Also, each bit within a memory word is accessed by a set of bit lines.

FIG. 2 shows SRAM cell 10 located with a first row and a first column of an SRAM 100. For simplicity, SRAM 100 includes memory words that consist of a single memory cell. In other instances, an SRAM will contain memory words that comprise multiple memory cells. In the example of FIG. 2, SRAM 100 includes bit lines 101-108, word lines 111-114, and write-word lines 121-124. Bit lines 101-108 are coupled to column MUX 130, which is coupled to column lines 131-132. SRAM cell 10, FETs 20 and 22 are respectively coupled to bit lines 101 and 105, enable inputs 34 are coupled to word line 111, and delay input 25 is coupled to write word-line 121. During a write and a read of SRAM cell 10, bit lines 101-105 exchange data through MUX 130 and ultimately with column lines 131-132. During a read, word line 111 carries an enable signal to the pass gates of SRAM cell 10 and to the pass gates of all of the other memory cells that share a row with SRAM cell 10. Mux 130 then selects bit lines 101 and 105 and the data stored at SRAM cell 10 may be communicated to column inputs 131-132. During a write, word line 111 also enables the pass gates of SRAM cell 10 and pass gates of the other memory cells in the first row. The write word-line 121 then carries a bypass signal to SRAM cell 10 (and all of the other memory cells that share a row with SRAM cell 10). Next, a write driver (not shown) drives new data through MUX 130 to the selected bit-lines 101 & 105 and up to SRAM cell 10. Thus, SRAM cell 10 is written.

Unfortunately, because write-word line 121 also communicates the bypass signal to all of the SRAM cells that share a row with SRAM cell 10, all of the other SRAM cells within the row are bypassed and are therefore vulnerable to an SEU.

SUMMARY

A Static Random Access Memory (SRAM) and a method of operation are presented. The SRAM includes column and row arrays of individual memory cells. Each memory cell includes a delay coupled with a pair of cross coupled inverters. The SRAM includes a plurality of memory words that are comprised of at least one memory cell. A dedicated write-word line is coupled to each memory word within the SRAM. The write-word line carries delay and bypass signals. The delay signal indicates that an individual memory word is to be delayed. The bypass signal indicates that the individual memory word is to be bypassed. By operating the SRAM in this manner, a Soft Error Rate (SER) of the SRAM is reduced.

In another example, a reduced number of memory words within an SRAM share a dedicated write-word line. In this manner, an SRAM may increase its dynamic SER but reduce the amount of dedicated write-word lines it uses.

These as well as other aspects and advantages will become apparent to those of ordinary skill in the art by reading the following detailed description, with reference where appropriate to the accompanying drawings. Further, it is understood that this summary is merely an example and is not intended to limit the scope of the claims.

BRIEF DESCRIPTION OF THE DRAWINGS

Certain examples are described below in conjunction with the appended drawing figures, wherein like reference numerals refer to like elements in the various figures, and wherein.

DETAILED DESCRIPTION

Figure 1A:
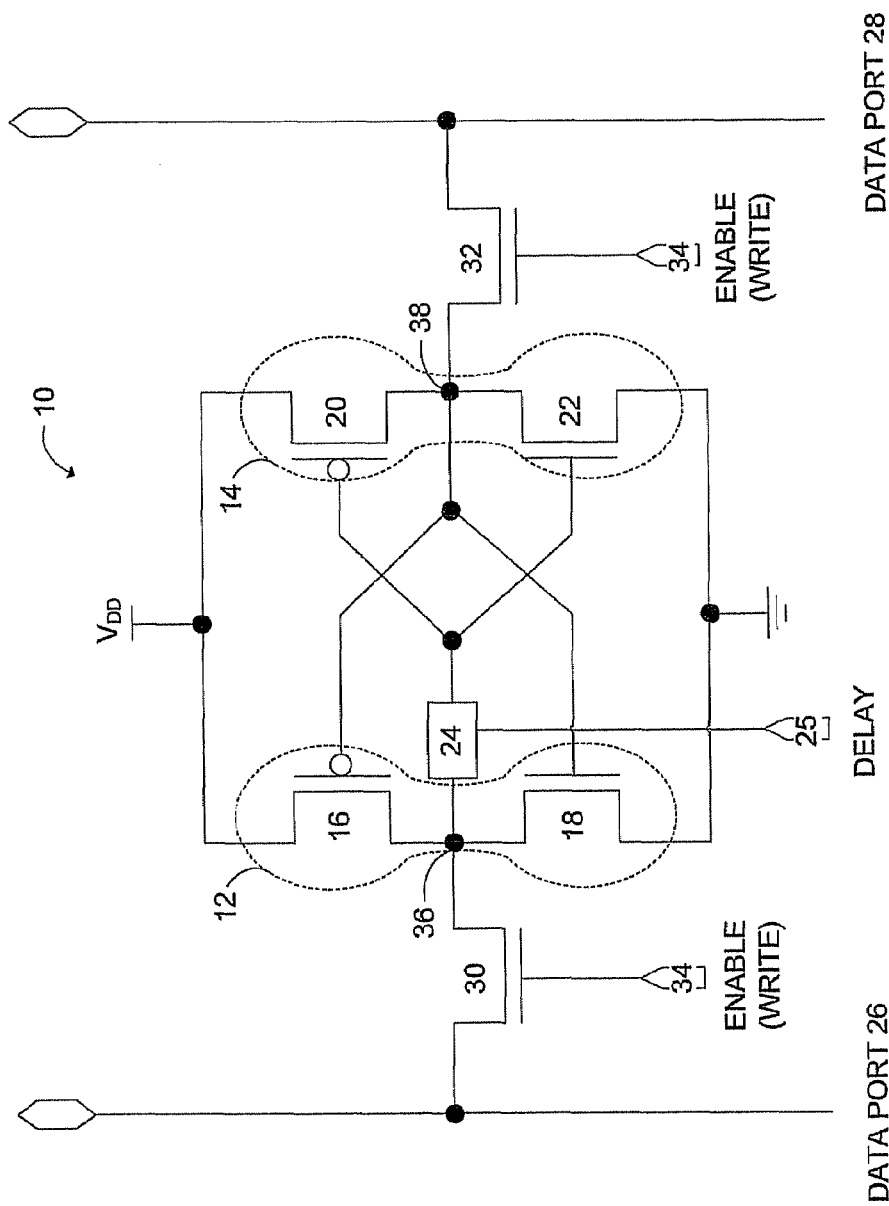
FIG. 1A is a circuit diagram of a Static Random Access Memory (SRAM) cell.
Figure 1B:
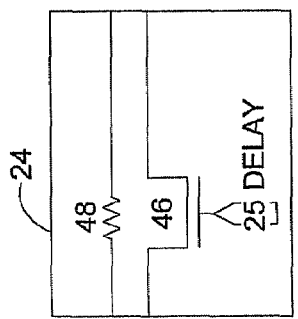
FIG. 1B is a circuit diagram of a delay element.
Figure 2:
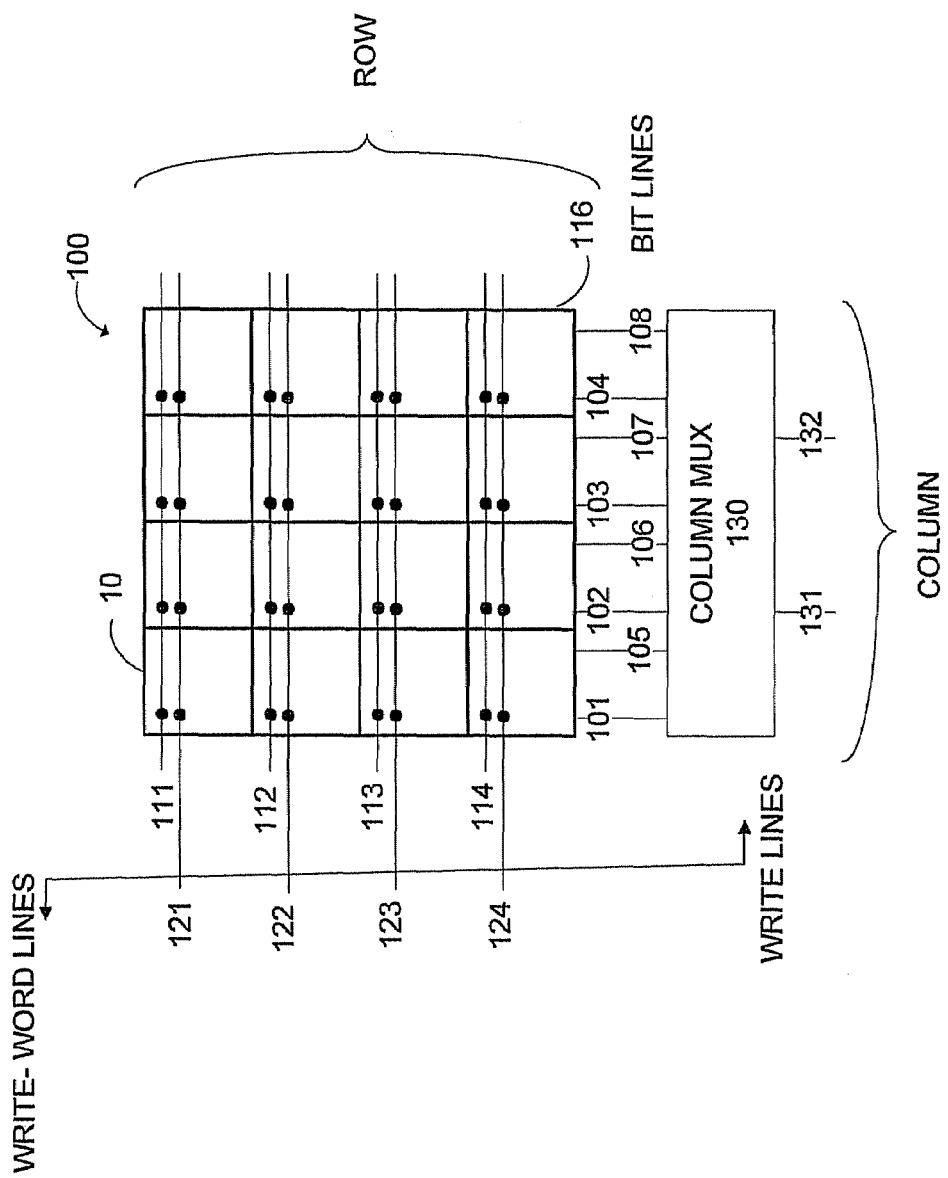
FIG. 2 is a circuit diagram of an SRAM.

Returning to FIG. 2, when a memory word within SRAM 100 is written, its delay is bypassed. As described above, this creates a vulnerability for other memory cells that share a row with the memory word being written. The memory word that is being written is protected because it is being written to and it is not in a storage state). The unprotected memory cells, however are particularly vulnerable to SEUs and result in an increase in the dynamic SER of SRAM 100. The dynamic SER is a function of speed and can be calculated using information about the memory architecture, the hardened mode static error rate and the un-hardened mode static error rate. The hardened mode static rate is the probability of an upset when the delay of a memory cell is not-bypassed. The unhardened mode static rate is the probability of an upset when the delay of a memory cell is bypassed. The dynamic SER of a memory may be calculated as follows:

$$\text{dynamic SER} = \text{hardened SER} \times (\text{\# bits not accessed}) + \\ \text{unhardened SER} \times (\text{\# bits accessed}) \times (\text{write \%}) + \text{hardened SER} \times (\text{\# bits accessed}) \times (1 - \text{write \%})$$

Where dynamic SER is the dynamic error rate, hardened SER is the static error rate with a non-bypassed delay, unhardened SER is the static error rate of a bypassed delay, write % is the percentage of time dedicated to a write, # bits not accessed is the number of bits not accessed during a write, and # bits accessed is the number of bits accessed during a write. For example, for the SRAM 100, if a single cell is being written, assuming writing 50% of a clock cycle for 30% of the clock time, the dynamic SER would be:

$$\text{dynamic SER} = \text{hardened SER} \times (12) + \text{unhardened} \\ \text{SER} \times (4) \times 0.5 \times 0.3 \text{ hardened SER} \times (4) \times (1 - 0.5 \times 0.3)$$

In general, if the unhardened SER is much less than the hardened SER, a small number of memory cells may become a significant contribution to the dynamic SER. Moreover, as the frequency of the clock cycles and the write times increase, the dynamic SER will likewise increase.

Figure 3:
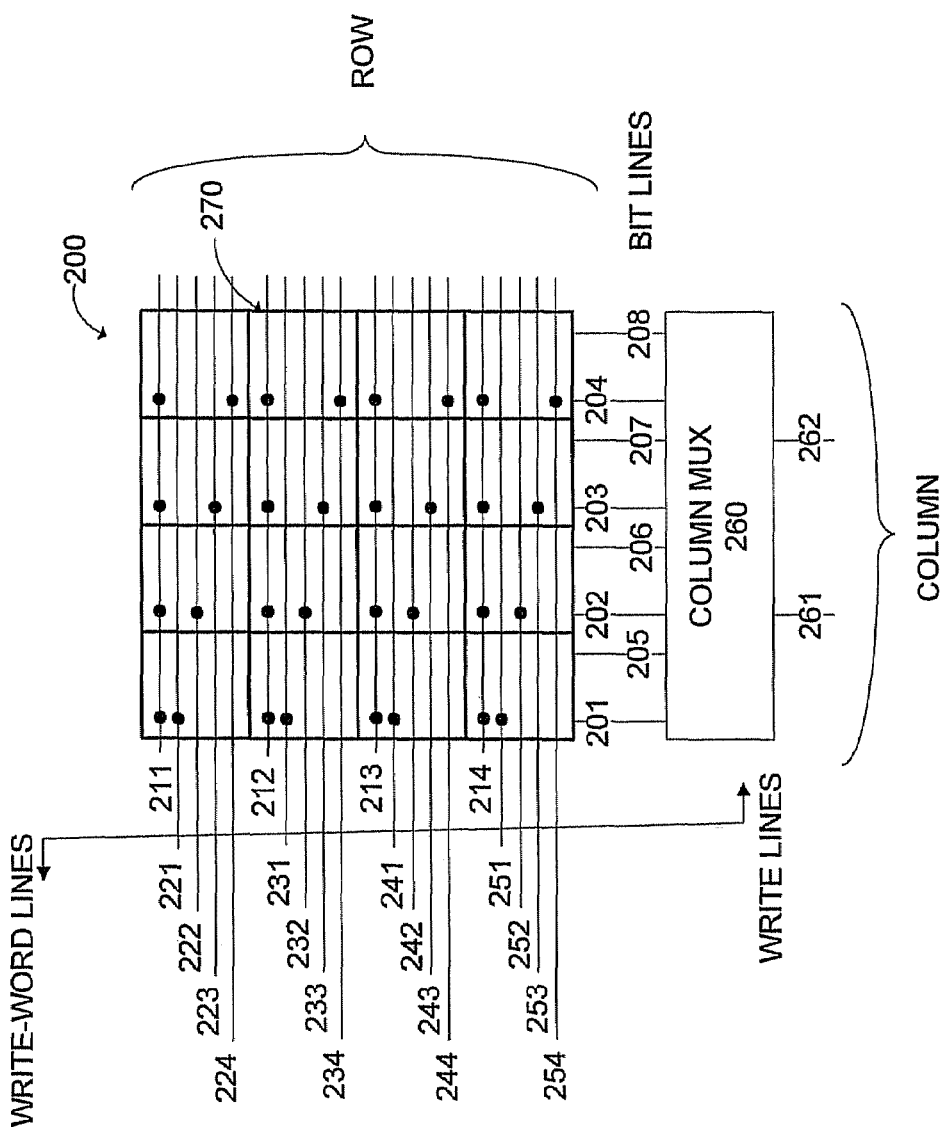
FIG. 3 is a circuit diagram of an SRAM with dedicated write-word lines.

FIG. 3 shows an SRAM 200 having an improved dynamic SER that uses a split write control. SRAM 200 includes a plurality of memory cells that are accessed by bit lines 201-208, write lines 211-214, and write-word lines 221-224, 231-234, 241-244, and 251-254. SRAM 200, in a similar fashion to SRAM 100, uses bit lines 201-208 to exchange data signals. MUX 260 channels these data signals to column lines 261 and 262. Each cell within SRAM 200 may be a similar or equivalent in design to SRAM cell 10. For simplicity, SRAM 200 is shown having memory words that comprise a single memory cell. In other instances, however, an SRAM may have memory words that include a plurality of individual memory cells.

Under normal operation, every memory word that is not being written, receives a delay signal on its dedicated write-word line. To read and write a memory word within SRAM 200, column MUX 260 first selects the appropriate column. Then, one of the word lines 211-214 communicates an enable signal to each memory cell within the appropriate row. The SRAM can then be read, or, if it is to be written, one of the write-word lines communicates a bypass signal to the appropriate memory cell. For instance, to write memory cell 270, write line 212 would communicate an enable signal, write-word line 234 would communicate a bypass signal, and write driver (not shown) would drive bit lines 204 and 208 (via MUX 260).

SRAM cell 200 improves its dynamic SER by only allowing a cell to be written to when it receives both an enable signal and a bypass signal. Therefore the dynamic SER rate of SRAM cell 200 is as follows:

$$\text{dynamic SER} = \text{hardened SER} \times (\text{\# bits in memory})$$

Where dynamic SER is the dynamic error rate, hardened SER is the static error rate with a non-bypassed delay, # bits in memory is the number of bits in a memory.

Figure 4:
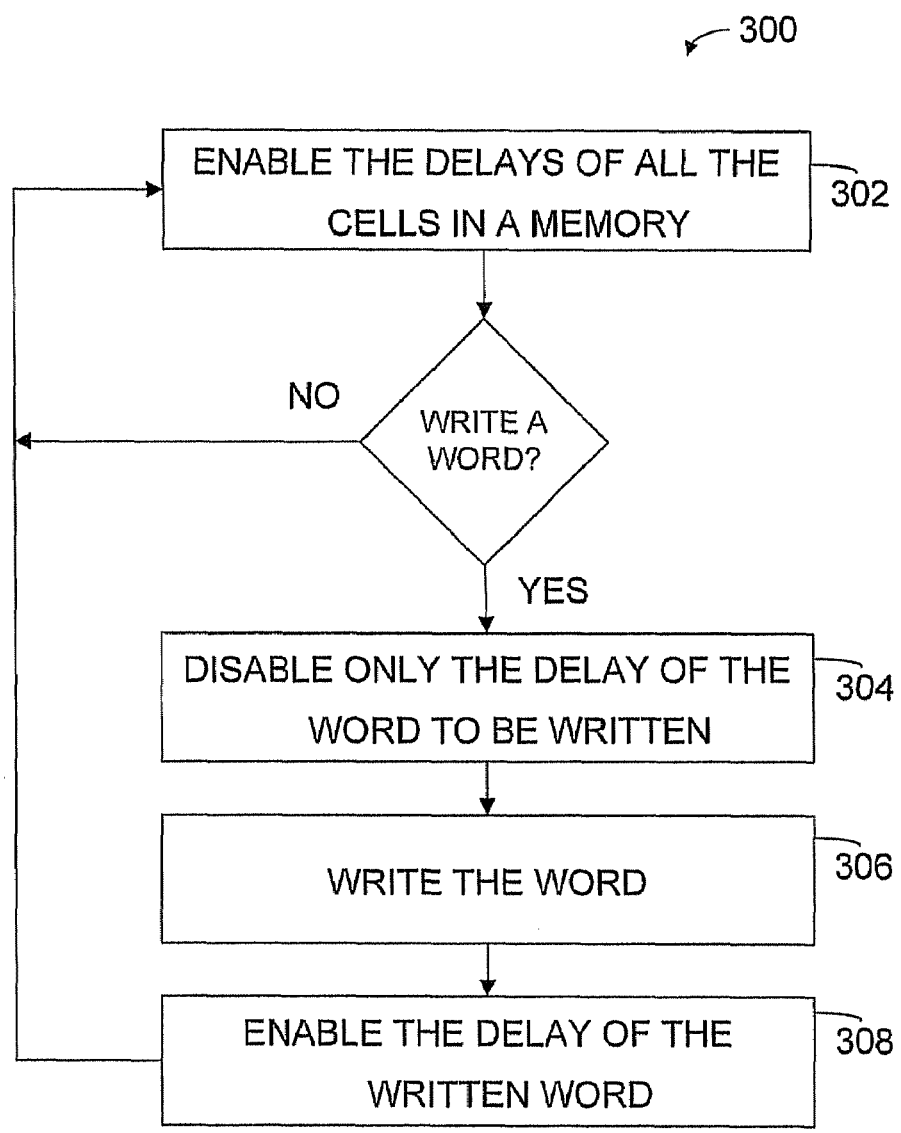
FIG. 4 is a flow diagram of a method of operating an SRAM with dedicated write-word lines.

FIG. 4 shows a method 300 of operating an SRAM having a split write control. Method 300 may be applied to write any memory word within an SRAM, such as SRAM 250 for instance. At block 302, all of the memory cells within an SRAM have their delays enabled. In SRAM 200, this would be carried out by communicating a delay signal to each memory cell within SRAM 200. Next, at block 304, when a memory word is to be written, only the delays of the memory cells within the memory word are disabled. In SRAM 200, this would be carried when the appropriate write-word line communicates a bypass signal to the delay of the memory cell. At this time, a write line may also communicate an enable signal to the pass gates of the memory cell. In some instances, the enable signal may be communicated to the memory cell prior to the bypass signal.

At block 306, the memory word is written. A write driver, for instance, may drive each bit line that is coupled to the memory word in order to set its voltage. Throughout the write, all the other memory cells within an SRAM that are not being written are disabled. At block 308, after the memory word is written, the delays of all the memory cells within the memory word are re-enabled.

As an additional or alternative example, multiple memory words may be written to at the same time. For instance, in FIG. 3, if MUX 260 allowed multiple write drivers to access multiple memory cells within SRAM 200, a bypass signal would be communicated to each memory cell that was being written. Again, similar to the examples described above, only the memory cells that are being written to should have disabled delays.

Figure 5:
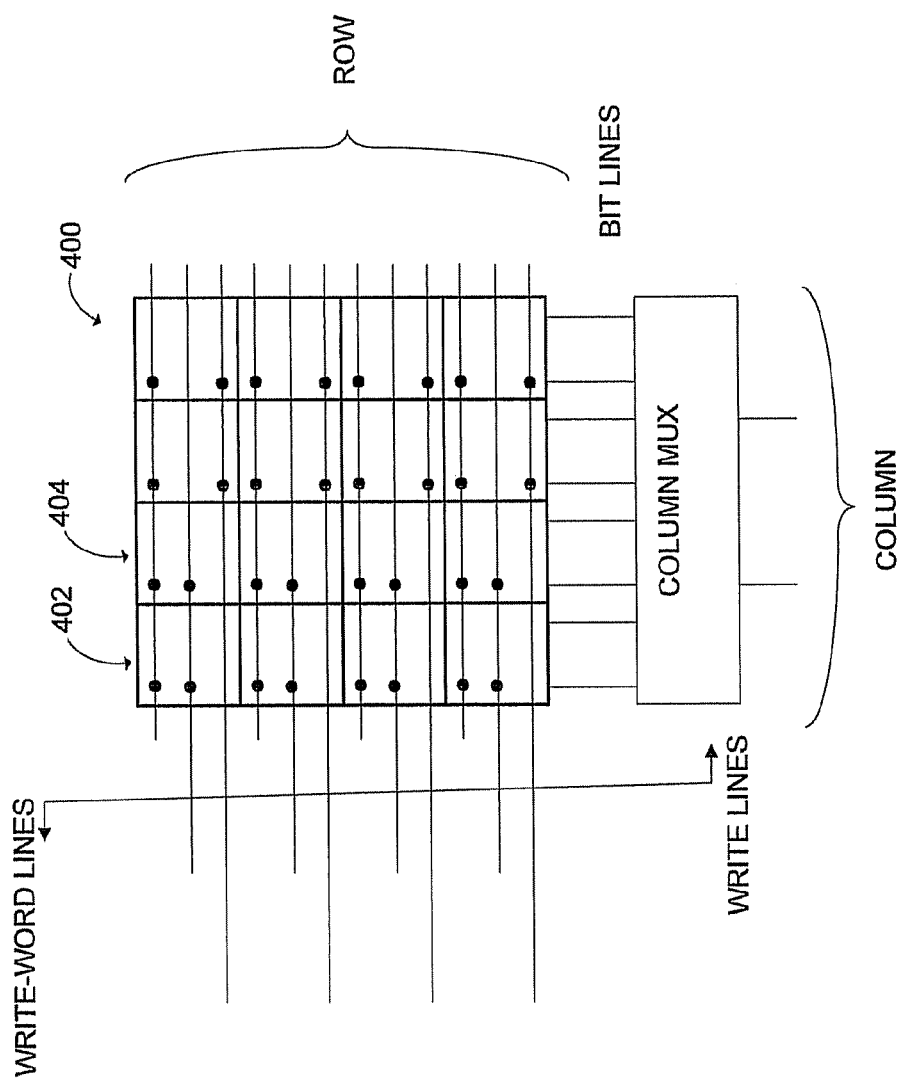
FIG. 5 is another circuit diagram of an SRAM with dedicated write-word lines.

In another example, an SRAM may have an improved dynamic SER by having some memory words share a write-word line. For instance, FIG. 5A shows an SRAM 400 that splits a write-word line between two memory cells. Instead of having a write-word dedicated to a single memory cell, a write-word is dedicated to two memory cells. As an example, memory cells 402 and 404 share a single write-word line 406. When memory cell 402 is being written, memory cells 402 and 404 have a bypassed delay. Instead of the entire row that memory cell 402 shares being vulnerable to an SEU, only memory cell 404 is vulnerable. Consequently the dynamic SER of SRAM 400 is improved with respect to SRAM 100. By having at least some memory cells share a write-word line, an SRAM may balance the benefits of an improved dynamic SER with an area penalty associated with an increased number of dedicated write-word lines.

SRAM 200 and 400 may include memory cells that are similar in structure to SRAM cell 10. Alternative SRAMs having a split write control may include a variety of inverters, transistors, and other circuit elements. For instance, although the described examples show a pair of cross-coupled inverters as feedback elements, an SRAM may include alternative feedback elements such as current starved inverters, tri-state inverters, and NAND gates. These alternative feedback elements may be arranged in a variety of configurations, such as a multiple interleaved configuration. In addition, other types of radiation hardened memories having memory cells that include a delay element may also benefit from the described methods. It should be understood that the illustrated examples are examples only and should not be taken as limiting the scope of the present invention. For instance, the illustrated SRAMs are comprised of sixteen memory words that each comprises a single memory cell. These illustrations contain a reduced number of cells in order to generally convey the structure and method of operating an SRAM with split write control. Also, in most scenarios, SRAMs with a far greater number of memory cells may benefit from a split write control. The claims should not be read as limited to the described order or elements unless stated to that effect. Therefore, all examples that come within the scope and spirit of the following claims and equivalents thereto are claimed as the invention.

We claim:

1. A Static Random Access Memory (SRAM), comprising:
   first and second bit lines for communicating data signals;
   first and second word lines for communicating enable signals;
   first, second, third, and fourth SRAM memory cells each including a delay component and an associated pair of feedback elements, the delay, in operation, increasing a response time of its associated pair of feedback elements an amount of time greater than a recovery time associated with a single event upset, wherein the response time is characterized by a switching time of an inverter in a pair of cross coupled inverters, and wherein the recovery time is characterized by an amount of time it takes for a radiation induced charge to dissipate, the first and second memory cells coupled to the first word line, the third and fourth memory cells coupled to the second word line, the first and third memory cells coupled to the first bit line, and the second and fourth memory cells coupled to the second bit line; and
   first, second, third, and fourth write-word lines for communicating delay and bypass signals, the first write-word line coupled to the delay of the first memory cell, the second write-word line coupled to the delay of the second memory cell, the third write-word line coupled to the delay of the third memory cell, and the fourth write-word line coupled to the delay of the fourth memory cell.

2. The device as in claim 1, wherein the enable signals and the data signals are used in combination to read from and write to each memory cell within the SRAM.

3. The device as in claim 1, wherein each memory cell within the SRAM receives the delay signal on its respective write-word line when it is not being written to, the delay signal increasing the response time of the associated pair of feedback elements it is communicated to.

4. The device as in claim 1, wherein each write-word line transmits the bypass signal when its associated memory cell is to be written to, the bypass signal decreasing the response time of the associated memory cell.

5. The device as in claim 4, wherein the decreased response time is less than the recovery time of the first memory cell.

* * * * *

UNITED STATES PATENT AND TRADEMARK OFFICE
CERTIFICATE OF CORRECTION

PATENT NO. : 7,693,001 B2
APPLICATION NO. : 12/013856
DATED : April 6, 2010
INVENTOR(S) : Keith W. Golke et al.

Page 1 of 1

It is certified that error appears in the above-identified patent and that said Letters Patent is hereby corrected as shown below:

Col. 6, Line 21 (Claim 1), "feedback elements an" should be --feedback elements to an--

Signed and Sealed this
Twenty-seventh Day of March, 2012

David J. Kappos
*Director of the United States Patent and Trademark Office*